United States Patent
Matsumoto et al.

(10) Patent No.: US 11,431,363 B2
(45) Date of Patent: Aug. 30, 2022

(54) RADIO FREQUENCY MODULE AND COMMUNICATION DEVICE

(71) Applicant: Murata Manufacturing Co., Ltd., Nagaokakyo (JP)

(72) Inventors: Naoya Matsumoto, Nagaokakyo (JP); Takayuki Shinozaki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/210,506

(22) Filed: Mar. 24, 2021

(65) Prior Publication Data

US 2021/0306017 A1 Sep. 30, 2021

(30) Foreign Application Priority Data

Mar. 31, 2020 (JP) .............................. JP2020-061798

(51) Int. Cl.
*H04B 1/04* (2006.01)
*H04B 1/03* (2006.01)

(52) U.S. Cl.
CPC ............. *H04B 1/0475* (2013.01); *H04B 1/03* (2013.01); *H04B 2001/0408* (2013.01)

(58) Field of Classification Search
CPC .................... H04B 1/40; H04B 1/0475; H04B 2001/0408; H04B 1/03
USPC ................................................ 375/295–297
See application file for complete search history.

(56) References Cited

U.S. PATENT DOCUMENTS

| | | | | |
|---|---|---|---|---|
| 7,348,856 B2* | 3/2008 | Shimizu | ................... | H03F 3/68 330/307 |
| 9,653,421 B2* | 5/2017 | Hattori | .................... | H01L 25/00 |
| 10,541,716 B1* | 1/2020 | Vazny | ...................... | H04B 1/18 |
| 2005/0258452 A1* | 11/2005 | Konishi | ............. | H01L 23/4824 257/197 |
| 2007/0210866 A1* | 9/2007 | Sato | .......................... | H03F 3/72 330/126 |
| 2008/0088376 A1* | 4/2008 | Tateoka | .................... | H03F 1/56 330/277 |

(Continued)

FOREIGN PATENT DOCUMENTS

| | | |
|---|---|---|
| EP | 3 557 613 A1 | 10/2019 |
| JP | 2019-176452 A | 10/2019 |
| WO | 2018/168500 A1 | 9/2018 |

OTHER PUBLICATIONS

Office Action dated Mar. 21, 2022 in Korean Patent Application No. 10-2021-0033113, 9 pages.

*Primary Examiner* — Emmanuel Bayard
(74) *Attorney, Agent, or Firm* — Xsensus LLP

(57) ABSTRACT

A radio frequency module includes: a module board; a first semiconductor device containing a first power amplifier and a second power amplifier, the first power amplifier being configured to amplify a radio frequency signal of a first communication band, the second power amplifier being configured to amplify a radio frequency signal of a second communication band, the second communication band being different from the first communication band; and a second semiconductor device containing a control circuit configured to control the first power amplifier and the second power amplifier. In the radio frequency module, the first semiconductor device and the second semiconductor device are stacked together and disposed on the module board.

19 Claims, 5 Drawing Sheets

(56) References Cited

U.S. PATENT DOCUMENTS

| | | | |
|---|---|---|---|
| 2013/0257565 A1* | 10/2013 | Masuda | H01L 25/162 |
| | | | 333/247 |
| 2014/0049321 A1* | 2/2014 | Gebeyehu | H03F 3/195 |
| | | | 330/279 |
| 2015/0133067 A1 | 5/2015 | Chang et al. | |
| 2015/0244410 A1* | 8/2015 | Leong | H01L 21/76898 |
| | | | 455/73 |
| 2018/0152644 A1* | 5/2018 | Kondo | H04N 5/345 |
| 2018/0226367 A1* | 8/2018 | Babcock | H03F 1/347 |

* cited by examiner

RADIO FREQUENCY MODULE AND COMMUNICATION DEVICE

CROSS-REFERENCE TO RELATED APPLICATION

The present application is based on and claims priority of Japanese Patent Application No. 2020-061798 filed on Mar. 31, 2020. The entire disclosure of the above-identified application, including the specification, drawings and claims is incorporated herein by reference in its entirety.

TECHNICAL FIELD

The present disclosure relates to a radio frequency (RF) module and a communication device.

BACKGROUND

In mobile communication devices such as a mobile phone, the arrangement configuration of circuit components included in radio frequency front-end modules is becoming complex, particularly with developments in multiband technologies.

U.S. Patent Application Publication No. 2015/0133067 discloses a front-end module including a power amplifier, a switch, a filter, etc. in a package.

SUMMARY

Technical Problems

Further miniaturization is desirable for such conventional front-end modules.

In view of the above, the present disclosure is presented to provide a radio frequency module and a communication device which are capable of implementing miniaturization.

Solutions

A radio frequency module according to one aspect of the present disclosure includes: a module board; a first semiconductor device containing a first power amplifier and a second power amplifier, the first power amplifier being configured to amplify a radio frequency signal of a first communication band, the second power amplifier being configured to amplify a radio frequency signal of a second communication band, the second communication band being different from the first communication band; and a second semiconductor device containing a control circuit configured to control the first power amplifier and the second power amplifier. In the radio frequency module, the first semiconductor device and the second semiconductor device are stacked together and disposed on the module board.

Advantageous Effects

With the radio frequency module according to one aspect of the present disclosure, it is possible to implement miniaturization.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
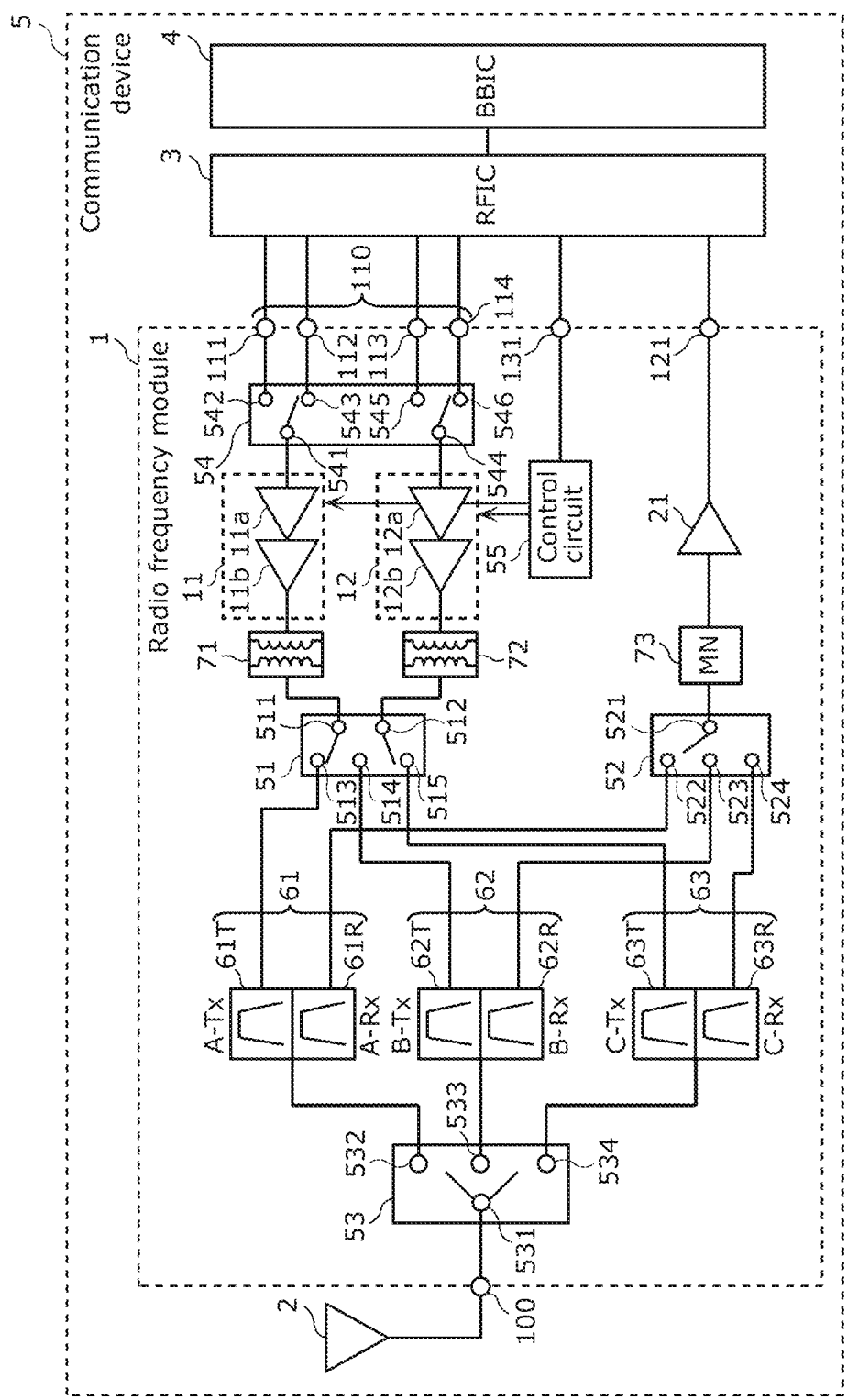
FIG. 1 is a diagram illustrating a circuit configuration of a radio frequency module and a communication device according to Embodiment 1.

The following describes in detail embodiments of the present disclosure with reference to the drawings. Each of the embodiments described below illustrates a general or specific example. The numerical values, shapes, materials, structural components, the arrangement and connection of the structural components, and so on, illustrated in the following embodiments are mere examples, and therefore do not limit the present disclosure.

It should be noted that, each of the diagrams is a schematic diagram to which an emphasis, an omission, or an adjustment of ratios has been applied as appropriate to illustrate the present disclosure, and thus is not necessarily strictly illustrated. There are instances where the shapes, positional relationships, and ratios illustrated in the diagrams are different from the actual shapes, actual positional relationships, and actual ratios. In each of the diagrams, substantially the same structural components are denoted by the same reference signs, and redundant description may be omitted or simplified.

In each of the diagrams described below, the x-axis and the y-axis are orthogonal to each other on a plane parallel to the principal surface of the module board. In addition, the z-axis is perpendicular to the principal surface of the module board. The positive direction of the z-axis indicates an upward direction and the negative direction of the z-axis indicates a downward direction.

In addition, in the circuit configuration according to the present disclosure, the meaning of "to be connected" includes not only to be directly connected via a connection terminal and/or a line conductor, but also to be electrically connected via other circuit elements. The meaning of "to be connected between A and B" is to be connected to both A and B between A and B.

In addition, in the component arrangement according to the present disclosure, the meaning of "in a plan view of a module board" is to view an object by orthographically projecting the object on the xy-plane from the z-axis positive side. The meaning of "A overlaps B in a plan view of a module board" is that at least a portion of the region of A orthographically projected on the xy-plane overlaps at least a portion of the region of B orthographically projected on the xy-plane. The meaning of "A does not overlap B in a plan view of a module board" is that the region of A orthographically projected on the xy-plane does not overlap any portion of the region of B orthographically projected on the xy-plane. The meaning of "A is disposed between B and C" is that at least one of a plurality of line segments connecting arbitrary points in B and arbitrary points in C passes through A. Terms indicating the relationships between elements such as "parallel" and "perpendicular" do not represent only the strict meanings but include also a substantially equivalent range, such as a difference of approximately several percent.

The meaning of "a component is disposed on a board" includes not only that the component is disposed on the board in a state in which the component is in contact with the board, but also that the component is disposed above the board without contacting the board (e.g., the component is stacked on another component disposed on the board), and that a portion or the whole of the component is embedded in the board. The meaning of "a component is disposed on a principal surface of a board" includes not only that the component is disposed on the principal surface in a state in which the component is in contact with the principal surface of the board, but also that the component is disposed above the principal surface of the board without contacting the principal surface, and that a portion of the component is embedded in the board from a principal surface side.

Embodiment 1

1.1 Circuit Configuration of Radio Frequency Module 1 and Communication Device 5

The following describes circuit configurations of radio frequency module (or RF front-end circuitry) 1 and communication device 5 according to the present embodiment. FIG. 1 is a diagram illustrating a circuit configuration of radio frequency module 1 and communication device 5 according to Embodiment 1.

1.1.1 Circuit Configuration of Communication Device 5

First, the circuit configuration of communication device 5 will be described. As illustrated in FIG. 1, communication device 5 according to the present embodiment includes radio frequency module 1, antenna 2, radio frequency integrated circuit (RFIC) 3, and baseband signal processing circuit (BBIC) 4.

Radio frequency module 1 transfers a radio frequency signal between antenna 2 and RFIC 3. The internal configuration of radio frequency module 1 will be described later.

Antenna 2 is connected to antenna connection terminal 100 of radio frequency module 1, and transmits a radio frequency signal that has been output from radio frequency module 1. In addition, antenna 2 receives a radio frequency signal from the outside, and outputs the received radio frequency signal to radio frequency module 1.

RFIC 3 is one example of a signal processing circuit that processes a radio frequency signal. More specifically, RFIC 3 performs signal processing, by down-conversion or the like, on a radio frequency reception signal input via the reception path of radio frequency module 1, and outputs the reception signal generated by the signal processing to BBIC 4. In addition, RFIC 3 performs signal processing, by up-conversion or the like, on a transmission signal input from BBIC 4, and outputs the radio frequency transmission signal generated by the signal processing to the transmission path of radio frequency module 1. In addition, RFIC 3 includes a controller that controls a switch, an amplifier, etc. included by radio frequency module 1. It should be noted that a portion or the whole of the functions of RFIC 3 as a controller may be located outside RFIC 3, and may be located, for example, in BBIC 4 or radio frequency module 1.

BBIC 4 is a baseband signal processing circuit that performs signal processing using an intermediate frequency band including frequencies lower than frequencies of a radio frequency signal that is transferred by radio frequency module 1. The signals processed by BBIC 4 include, for example, an image signal for image display and/or a sound signal for telephone conversation via a speaker.

It should be noted that, in communication device 5 according to the present embodiment, antenna 2 and BBIC 4 are not indispensable components.

1.1.2 Circuit Configuration of Radio Frequency Module 1

Next, a circuit configuration of radio frequency module 1 will be described. As illustrated in FIG. 1, radio frequency module 1 includes power amplifiers 11 and 12, low noise amplifier 21, switches 51 to 54, control circuit 55, duplexers 61 to 63, transformers 71 and 72, matching circuit (matching network (MN)) 73, antenna connection terminal 100, a plurality of radio frequency input terminals 110, radio frequency output terminal 121, and control terminal 131.

Antenna connection terminal 100 is one example of an external-connection terminal. Antenna connection terminal 100 is connected to antenna 2.

The plurality of radio frequency input terminals 110 are each one example of the external-connection terminal, and is a terminal for receiving a plurality of radio frequency transmission signals from outside radio frequency module 1. According to the present embodiment, the plurality of radio frequency input terminals 110 include four radio frequency input terminals 111 to 114.

As the plurality of radio frequency signals that the plurality of radio frequency input terminals 110 receive from outside, for example, radio frequency signals of mutually different communication systems and/or radio frequency signals of mutually different communication bands may be used.

The communication system means a communication system established using a radio access technology (RAT). According to the present embodiment, for example, the 5th generation new radio (5GNR) system, the long term evolution (LTE) system, a wireless local area network (WLAN) system, etc. may be used as the communication system. However, the communication system is not limited to these examples.

The communication band means a frequency band predefined for a communication system by standard-setting organizations or the like such as the 3rd generation partnership project (3GPP), the institute of electrical and electronics engineers (IEEE), etc.

It should be noted that a total number of the plurality of radio frequency input terminals 110 is not limited to four. For example, the total number of the plurality of radio frequency input terminals 110 may be less than four or more than four.

Radio frequency output terminal 121 is one example of the external-connection terminal, and is a terminal for providing a plurality of radio frequency reception signals to the outside of radio frequency module 1. It should be noted that radio frequency module 1 may include a plurality of radio frequency output terminals.

Control terminal 131 is one example of the external-connection terminal, and is a terminal for receiving a control signal from the outside of radio frequency module 1. As the control signal, for example, a signal for controlling power amplifiers 11 and 12 may be used.

Power amplifier 11 is one example of a first power amplifier, and is capable of amplifying a plurality of radio frequency signals received by the plurality of radio frequency input terminals 110. Here, power amplifier 11 is capable of amplifying a radio frequency signal of communication band A that has been input from radio frequency input terminal 111 and/or radio frequency input terminal 112 via switch 54.

Power amplifier 12 is one example of a second power amplifier, and is capable of amplifying a plurality of radio frequency signals received by the plurality of radio frequency input terminals 110. Here, power amplifier 12 is capable of amplifying radio frequency signals of communication bands B and C that have been input from radio frequency input terminal 113 and/or radio frequency input terminal 114 via switch 54.

Each of power amplifiers 11 and 12 is a multistage amplifier. In other words, each of power amplifiers 11 and 12 includes a plurality of amplifying elements connected in a cascade arrangement. More specifically, power amplifier 11 includes amplifying element 11a that corresponds to an input stage and amplifying element 11b that corresponds to an output stage. In addition, power amplifier 12 includes amplifying element 12a that corresponds to an input stage and amplifying element 12b that corresponds to an output stage. It should be noted that a total number of stages of each of power amplifiers 11 and 12 is not limited to two, but may be three or more. Power amplifier 11 and/or power amplifier 12 may have a single stage structure.

Power amplifier 11 and/or power amplifier 12 may amplify a radio frequency signal by transforming the radio frequency signal into a differential signal (i.e., a complementary signal). Such power amplifier 11 and/or power amplifier 12 as described above are each referred to as a differential amplifier in some cases. In this case, power amplifier 11 and/or power amplifier 12 may output a differential signal.

Transformer 71 is connected between power amplifier 11 and transmission filter 61T. More specifically, transformer 71 is connected between an output terminal of power amplifier 11 and terminal 511 of switch 51. Transformer 71 is capable of matching the impedance of power amplifier 11 with the impedance of transmission filter 61T. It should be noted that, under the condition that power amplifier 11 outputs a differential signal, transformer 71 functions as a balun (balanced to unbalanced transformer element).

Transformer 72 is connected between power amplifier 12 and transmission filters 62T and 63T. More specifically, transformer 72 is connected between the output terminal of power amplifier 12 and terminal 512 of switch 51. Transformer 72 is capable of matching the impedance of power amplifier 12 with the impedance of transmission filters 62T and 63T. It should be noted that, under the condition that power amplifier 12 outputs a differential signal, transformer 72 functions as a balun (balanced to unbalanced transformer element).

matching circuit 73 is connected between low noise amplifier 21 and reception filters 61R to 63R. More specifically, matching circuit 73 is connected between an input terminal of low noise amplifier 21 and terminal 521 of switch 52. Matching circuit 73 matches the impedance of low noise amplifier 21 with the impedance of reception filters 61R and 63R.

Low noise amplifier 21 is capable of amplifying a plurality of radio frequency signals received by antenna connection terminal 100. Here, low noise amplifier 21 is capable of amplifying radio frequency signals of communication bands A to C which have been input through antenna connection terminal 100 via switch 53, duplexers 61 to 63, and switch 52. The radio frequency signals amplified by low noise amplifier 21 are output to radio frequency output terminal 121. The configuration of low noise amplifier 21 is not specifically limited.

Duplexer 61 passes a radio frequency signal of communication band A. Duplexer 61 transfers a transmission signal and a reception signal of communication band A in a frequency division duplex (FDD) system. Duplexer 61 includes transmission filter 61T and reception filter 61R.

Transmission filter 61T is connected between switch 51 and antenna connection terminal 100. Transmission filter 61T passes a signal in a transmission band of communication band A among the radio frequency transmission signals that have been amplified by power amplifier 11.

Reception filter 61R is connected between switch 52 and antenna connection terminal 100. Reception filter 61R passes a signal in a reception band of communication band A among the radio frequency reception signals that have been input through antenna connection terminal 100.

Duplexer 62 passes a radio frequency signal of communication band B. Duplexer 62 transfers a transmission signal and a reception signal of communication band B in the FDD system. Duplexer 62 includes transmission filter 62T and reception filter 62R.

Transmission filter 62T is connected between switch 51 and antenna connection terminal 100. Transmission filter 62T passes a signal in a transmission band of communication band B among the radio frequency transmission signals that have been amplified by power amplifier 12.

Reception filter 62R is connected between switch 52 and antenna connection terminal 100. Reception filter 62R passes a signal in a reception band of communication band B among the radio frequency reception signals that have been input through antenna connection terminal 100.

Duplexer 63 passes a radio frequency signal of communication band C. Duplexer 63 transfers a transmission signal and a reception signal of communication band C in the FDD system. Duplexer 63 includes transmission filter 63T and reception filter 63R.

Transmission filter 63T is connected between switch 51 and antenna connection terminal 100. Transmission filter 63T passes a signal in a transmission band of communication band C among the radio frequency transmission signals that have been amplified by power amplifier 12.

Reception filter 63R is connected between switch 52 and antenna connection terminal 100. Reception filter 63R passes a signal in a reception band of communication band C among the radio frequency reception signals that have been input through antenna connection terminal 100.

As communication band A, for example, a communication band that belongs to a high band group can be used. The high band group is a frequency band group including a plurality of communication bands, and is higher than the middle band group. The high band group has, for example, a frequency range from 2.4 GHz to 2.8 GHz. The high band group includes, for example, a communication band for LTE such as band B7 (uplink: 2500 MHz to 2570 MHz, downlink: 2620 MHZ to 2690 MHz).

As communication bands B and C, for example, a communication band that belongs to a middle band group can be used. The middle band group is a frequency band group including a plurality of communication bands, and is lower than the high band group. The middle band group has, for example, a frequency range from 1.5 GHz to 2.2 GHz. The middle band group includes, for example, communication bands for LTE such as band B1 (uplink: 1920 MHz to 1980 MHz, downlink: 2110 MHz to 2170 MHz), band B39 (1880 MHz to 1920 MHz), and band B66 (uplink: 1710 MHz to 1780 MHz, downlink: 2110 MHz to 2200 MHz).

Switch 51 is one example of the first switch, and is connected between transmission filters 61T to 63T and power amplifiers 11 and 12. Specifically, switch 51 includes terminals 511 to 515. Terminal 511 of switch 51 is one example of the first terminal. Terminal 511 is connected to the output terminal of power amplifier 11. Terminal 512 of switch 51 is one example of the second terminal. Terminal 512 is connected to the output terminal of power amplifier 12. Terminals 513 to 515 of switch 51 are connected respectively to transmission filters 61T to 63T. In the above-described connection configuration, switch 51 is capable of connecting and disconnecting terminal 511 and terminal 513, and connecting one of terminal 514 and terminal 515 to terminal 512, based on a control signal from RFIC 3, for example. In other words, switch 51 is capable of connecting and disconnecting power amplifier 11 and transmission filter 61T, and also capable of switching connection of power amplifier 12 between transmission filter 62T and transmission filter 63T. Switch 51 is implemented as, for example, a multiple-connection switching circuit, and referred to as a band selection switch.

Switch 52 is connected between low noise amplifier 21 and reception filters 61R to 63R. Specifically, switch 52 includes terminals 521 to 524. Terminal 521 of switch 52 is connected to an input terminal of low noise amplifier 21. Terminals 522 to 524 of switch 52 are connected respectively to reception filters 61R to 63R. In the above-described connection configuration, switch 52 is capable of connecting one of terminals 522 to 524 to terminal 521, based on a control signal from RFIC 3, for example. In other words, switch 52 is capable of switching connection of low noise amplifier 21 between reception filter 61R, reception filter 62R, and reception filter 63R. Switch 52 is implemented as, for example, a single-pole triple-throw (SP3T) switching circuit, and is referred to as a low noise amplifier (LNA) IN switch.

Switch 53 is connected between antenna connection terminal 100 and duplexers 61 to 63. Specifically, switch 53 includes terminals 531 to 534. Terminal 531 of switch 53 is connected to antenna connection terminal 100. Terminals 532 to 534 of switch 53 are connected respectively to duplexers 61 to 63. In the above-described connection configuration, switch 53 is capable of connecting at least one of terminals 532, 533, or 534 to terminal 531, based on a control signal from RFIC 3, for example. More specifically, switch 53 is capable of connecting and disconnecting antenna 2 and duplexer 61, connecting and disconnecting antenna 2 and duplexer 62, and connecting and disconnecting antenna 2 and duplexer 63. Switch 53 is implemented as, for example, a multiple-connection switching circuit, and referred to as an antenna switch.

Switch 54 is one example of the second switch, and is connected between a plurality of radio frequency input terminals 110 and power amplifiers 11 and 12. Specifically, switch 54 includes terminals 541 to 546. Terminal 541 of switch 54 is one example of the third terminal, and is connected to an input terminal of power amplifier 11. Terminals 542 and 543 of switch 54 are connected respectively to radio frequency input terminals 111 and 112. Terminal 544 of switch 54 is one example of the fourth terminal, and is connected to an input terminal of power amplifier 12. Terminals 545 and 546 of switch 54 are connected respectively to radio frequency input terminals 113 and 114. In the above-described connection configuration, switch 54 is capable of connecting one of terminals 542 and 543 to terminal 541, and capable of connecting one of terminals 545 and 546 to terminal 544, based on a control signal from RFIC 3, for example. In other words, switch 54 is capable of switching connection of power amplifier 11 between radio frequency input terminal 111 and radio frequency input terminal 112, and capable of switching connection of power amplifier 12 between radio frequency input terminal 113 and radio frequency input terminal 114. Switch 54 is implemented as, for example, a multiple-connection switching circuit, and referred to as a transmission input switch.

Control circuit 55 is connected to control terminal 131. Control circuit 55 receives a control signal from RFIC 3 via control terminal 131, and outputs the control signal to power amplifiers 11 and 12. It should be noted that control circuit 55 may output the control signal to other circuit components.

It should be noted that one or some of the circuit elements illustrated in FIG. 1 need not necessarily be included in radio frequency module 1. For example, it is sufficient if radio frequency module 1 includes at least power amplifiers 11 and 12, and one of switch 51 and control circuit 55. Radio frequency module 1 need not necessarily include the other circuit elements.

With the circuit configuration of radio frequency module 1, a transmission signal and a reception signal can be communicated in the FDD system. However, the circuit configuration of the radio frequency module according to the present disclosure is not limited to this example. For example, the radio frequency module according to the present disclosure may have a circuit configuration capable of performing communication of a transmission signal and a reception signal in a time division duplex (TDD) system, or may have a circuit configuration capable of performing communication of a transmission signal and a reception signal in both the FDD system and the TDD system.

1.2 Component Arrangement of Radio Frequency Module 1

The following describes in detail the component arrangement of radio frequency module 1 configured as described above, with reference to FIG. 2 and FIG. 3.

Figure 2:
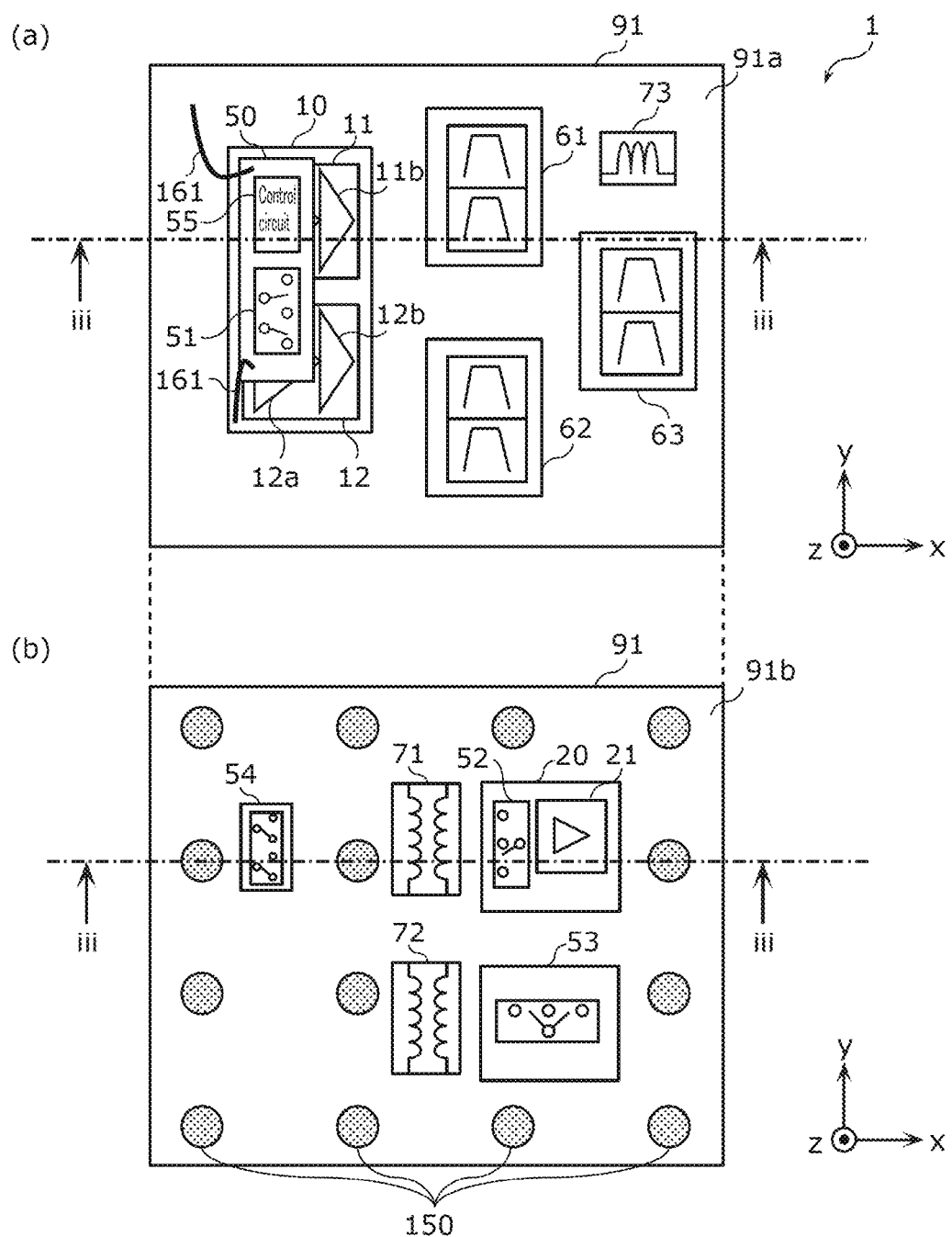
FIG. 2 illustrates a plan view of a radio frequency module according to Embodiment 1.
Figure 3:
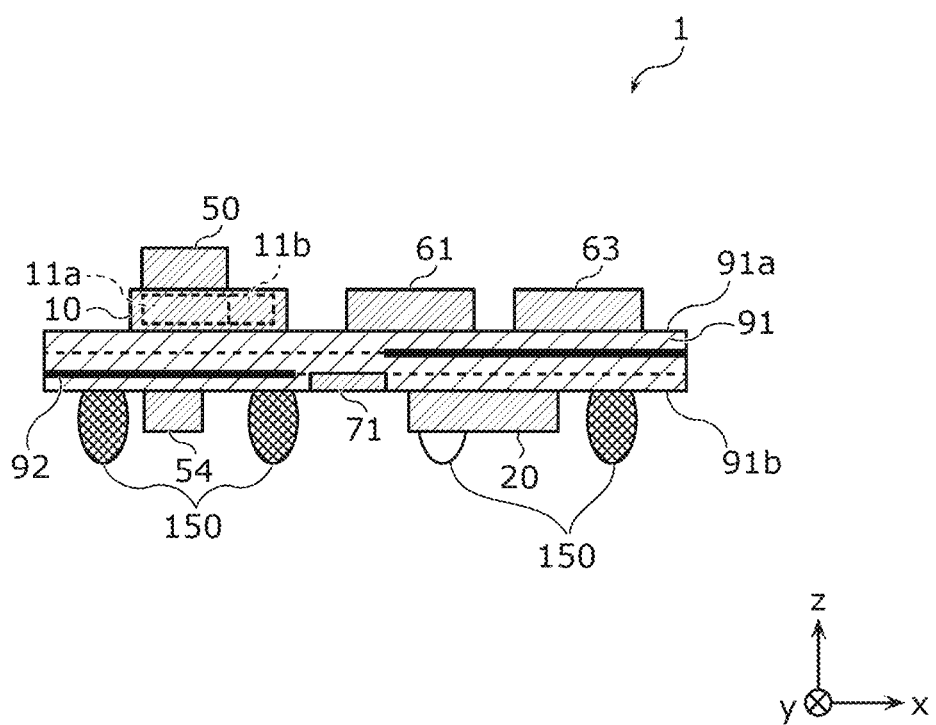
FIG. 3 illustrates a cross-sectional view of the radio frequency module according to Embodiment 1.

FIG. 2 illustrates a plan view of radio frequency module 1 according to Embodiment 1. In FIG. 2, (a) illustrates a view when principal surface 91a of module board 91 is viewed from the z-axis positive side, and (b) illustrates a view when principal surface 91b of module board 91 is viewed through from the z-axis positive side. FIG. 3 illustrates a cross-sectional view of radio frequency module 1 according to Embodiment 1. The cross-sectional surface of radio frequency module 1 illustrated in FIG. 3 is a cross-sectional surface taken along line iii-iii of FIG. 2.

As illustrated in FIG. 2 and FIG. 3, radio frequency module 1 further includes module board 91, ground electrode patterns 92, and a plurality of bump electrodes 150, in addition to the circuit components that contain the circuit elements illustrated in FIG. 1.

Module board 91 includes principal surface 91a and principal surface 91b on opposite sides thereof. As module board 91, for example, a low temperature co-fired ceramic (LTCC) board having a stacked structure including a plurality of dielectric layers, a high temperature co-fired ceramic (HTCC) board, a component built-in board, a board including a redistribution layer (RDL), or a printed board or the like can be used. However, module board 91 is not limited to these examples.

Principal surface 91a is one example of the first principal surface, and is referred to as an upper surface or a front surface in some cases. As illustrated in (a) in FIG. 2, semiconductor device 10 that contains power amplifiers 11 and 12, semiconductor device 50 that contains switch 51 and control circuit 55, duplexers 61 to 63, and matching circuit 73 are disposed on principal surface 91a.

Semiconductor device 10 is disposed on principal surface 91a, and semiconductor device 50 is stacked on semiconductor device 10. At this time, in a plan view of module board 91, a footprint of semiconductor device 50 overlaps both a footprint of power amplifier 11 and a footprint of power amplifier 12 contained in semiconductor device 10. More specifically, the footprint of semiconductor device 50 overlaps both a footprint of amplifying element 11a and a footprint of amplifying element 12a which correspond to the input stage of power amplifiers 11 and the input stage of power amplifier 12, respectively. However, semiconductor device 50 does not overlap amplifying element 11b corresponding to the output stage of power amplifiers 11 or amplifying element 12b corresponding to the output stage of power amplifier 12.

The semiconductor device is an electronic component including an electronic circuit formed on the front surface and inside of a semiconductor chip (also referred to as a die), and is also referred to as a semiconductor integrated circuit. The semiconductor device is, for example, configured by a complementary metal oxide semiconductor (CMOS), and specifically, may be fabricated by silicon on insulator (SOI) processing. With this, it is possible to manufacture a semiconductor device at a low manufacturing cost. It should be noted that the semiconductor device may include at least one of GaAs, SiGe, or GaN. This allows implementation of a high-quality semiconductor device.

Each of duplexers 61 to 63 may be, for example, any of a surface acoustic wave filter, an acoustic wave filter using a bulk acoustic wave (BAW), an LC resonant filter, and a dielectric filter, but not limited to these filters.

Matching circuit 73, for example, includes an inductor and/or capacitor, and is implemented using a surface mounted device (SMD). It should be noted that matching circuit 73 may be formed in module board 91, and may be implemented using an integrated passive device (IPD).

Principal surface 91b is one example of the second principal surface, and is referred to as a lower surface or a rear surface in some cases. As illustrated in (b) in FIG. 2, semiconductor device 20 that contains low noise amplifier 21 and switch 52, switches 53 and 54, transformers 71 and 72, and the plurality of bump electrodes 150 are disposed on principal surface 91b.

Switch 53 is disposed in proximity to bump electrode 150 that functions as antenna connection terminal 100 among the plurality of bump electrodes 150.

Switch 54 is disposed in proximity to bump electrodes 150 that function as a plurality of radio frequency input terminals among the plurality of bump electrodes 150. In a plan view of module board 91, a footprint of switch 54 overlaps a footprint of semiconductor device 10. More specifically, in a plan view of module board 91, the footprint of switch 54 overlaps at least one of the footprint of amplifying element 11a corresponding to the input stage of power amplifier 11 or a footprint of amplifying element 12a corresponding to the input stage of power amplifier 12. However, the footprint of switch 54 does not overlap a footprint of amplifying element 11b corresponding to the output stage of power amplifier 11 or the footprint of amplifying element 12b corresponding to the output stage of power amplifier 12.

It should be noted that, although switches 53 and 54 are not contained in semiconductor device 20 but disposed separately on principal surface 91b according to the present embodiment, switch 53 and/or switch 54 may be contained in semiconductor device 20.

Transformers 71 and 72 are each contained in module board 91. More specifically, transformers 71 and 72 are each provided inside module board 91 on a principal surface 91b side. It should be noted that transformer 71 and/or transformer 72 may be surface-mounted on principal surface 91a or 91b as chip circuit components.

Ground electrode patterns 92 are provided inside module board 91 and connected physically to bump electrode 150 set to a ground potential, for example. Ground electrode patterns 92 are disposed between semiconductor devices 10 and 20.

The plurality of bump electrodes 150 form a plurality of external-connection terminals including antenna connection terminal 100, the plurality of radio frequency input terminals 110, radio frequency output terminal 121, and control terminal 131. Each of the plurality of bump electrodes 150 is disposed on principal surface 91b of module board 91, and protrudes in the z-axis negative direction from principal surface 91b. The plurality of bump electrodes 150 each have an end that is connected to an input/output terminal and/or a ground electrode, etc. on a motherboard located in the z-axis negative direction relative to radio frequency module 1.

It should be noted that each of the components on module board 91 is connected to a pad electrode (not illustrated) or the like on module board 91 and/or other components via bonding wire 161, for example. In FIG. 2, some of bonding wires 161 bonded to semiconductor device 50 are illustrated as examples, and illustration of the other bonding wires 161 is omitted.

1.3 Advantageous Effects, Etc.

As described above, radio frequency module 1 according to the present embodiment includes module board 91; semiconductor device 10 containing power amplifier 11 and power amplifier 12, power amplifier 11 being configured to amplify a radio frequency signal of communication band A, power amplifier 12 being configured to amplify a radio frequency signal of communication band B, communication band B being different from communication band A; and semiconductor device 50 containing control circuit 55 configured to control power amplifier 11 and power amplifier 12. In radio frequency module 1, semiconductor device 10 and semiconductor device 50 are stacked together and disposed on module board 91.

According to the-above described configuration, since semiconductor device 10 and semiconductor device 50 can be stacked together, it is possible to reduce the area of module board 91 and thus to achieve miniaturization of radio frequency module 1. In addition, since semiconductor device 50 containing control circuit 55 that controls power amplifiers 11 and 12 and semiconductor device 10 containing power amplifiers 11 and 12 are stacked, it is possible to reduce the lengths of the lines between control circuit 55 and power amplifier 11 and between control circuit 55 and power amplifier 12. As a result, it is possible to inhibit a control signal that passes through the line between control circuit 55 and power amplifier 11 or the line between control circuit 55 and power amplifier 12 from flowing into a radio frequency signal as noise. In particular, under a condition that a control signal is a digital signal, it is possible reduce the inflow of a digital noise into a radio frequency signal. As a result, it is possible to improve electrical characteristics (e.g., noise figure (NF), gain characteristics, etc.) of radio frequency module 1.

In addition, for example, in radio frequency module 1 according to the present embodiment, in a plan view of module board 91, the footprint of semiconductor device 50 may overlap both the footprint of power amplifier 11 and the footprint of power amplifier 12 in semiconductor device 10.

According to this configuration, it is possible to further reduce the lengths of the lines between control circuit 55 and power amplifier 11 and between control circuit 55 and power amplifier 12. As a result, the inflow of noise into a radio frequency signal due to a control signal can further be reduced, and thus it is possible to further improve the electrical characteristics of radio frequency module 1.

In addition, for example, in radio frequency module 1 according to the present embodiment, in a plan view of module board 91, the footprint of semiconductor device 50 may overlap each of the footprint of amplifying element 11a that corresponds to an input stage of power amplifier 11 and the footprint of amplifying element 12a that corresponds to an input stage of power amplifier 12.

According to this configuration, it is possible to overlap semiconductor device 50 with the input stages of power amplifiers 11 and 12, allowing semiconductor device 50 to be spaced from the output stages of power amplifiers 11 and 12. In a power amplifier, in general, the amount of heat generated by the input stage is larger than the amount of heat generated by the output stage. Accordingly, it is possible to reduce the risk of failure of semiconductor device 50 due to heat emitted from the output stages of power amplifiers 11 and 12.

In addition, for example, in radio frequency module 1 according to the present embodiment, in a plan view of module board 91, the footprint of semiconductor device 50 may overlap neither the footprint of amplifying element 11b that corresponds to an output stage of power amplifier 11 nor the footprint of amplifying element 12b that corresponds to an output stage of power amplifier 12.

According to this configuration, it is possible to space semiconductor device 50 from the output stages of power amplifiers 11 and 12. As a result, it is possible to reduce the risk of failure of semiconductor device 50 due to heat emitted from the output stages of power amplifiers 11 and 12.

In addition, for example, in radio frequency module 1 according to the present embodiment, semiconductor device 10 may be disposed on module board 91, and semiconductor device 50 may be stacked on semiconductor device 10.

According to this configuration, it is possible to dispose, on module board 91, semiconductor device 10 that contains power amplifiers 11 and 12. As a result, it is possible to easily dissipate the heat generated by power amplifiers 11 and 12 via module board 91.

In addition, for example, in radio frequency module 1 according to the present embodiment, semiconductor device 50 may further contain switch 51 including terminal 511 connected to an output terminal of power amplifier 11 and terminal 512 connected to an output terminal of power amplifier 12.

According to this configuration, it is possible to stack switch 51 connected to the output terminals of power amplifiers 11 and 12 on power amplifiers 11 and 12. Accordingly, it is possible to reduce the lengths of the lines between switch 51 and power amplifier 11 and between switch 51 and power amplifier 12. As a result, mismatching loss due to wiring loss or wiring variation can be reduced, and thus it is possible to further improve the electrical characteristics of radio frequency module 1.

In addition, for example, radio frequency module 1 according to the present embodiment may further include switch 54 including terminal 541 connected to an input terminal of power amplifier 11 and terminal 544 connected to an input terminal of power amplifier 12, and semiconductor device 10 and switch 54 may be disposed on mutually opposite surfaces of module board 91.

According to this configuration, semiconductor device 10 and switch 54 can be disposed on both surfaces of module board 91, and thus it is possible to promote miniaturization of radio frequency module 1.

In addition, for example, radio frequency module 1 according to the present embodiment may further include a plurality of bump electrodes 150 as a plurality of external-connection terminals, module board 91 may include principal surface 91a and principal surface 91b on opposite sides of module board 91, semiconductor device 10 and semiconductor device 50 may be disposed on principal surface 91a, and the plurality of bump electrodes 150 and switch 54 may be disposed on second principal surface 91b.

According to this configuration, switch 54 connected to the input terminals of power amplifiers 11 and 12 can be disposed on principal surface 91b on which the plurality of bump electrodes 150 are disposed. As a result, switch 54 can be disposed in proximity to bump electrodes 150 that receive radio frequency transmission signals from RFIC 3, and thus it is possible to reduce the lengths of the lines between bump electrodes 150 and switch 51.

In addition, for example, in radio frequency module 1 according to the present embodiment, in a plan view of module board 91, the footprint of switch 54 may overlap the footprint of semiconductor device 10.

According to this configuration, it is possible to reduce the length of each of the line between switch 54 and power amplifier 11 and the line between switch 54 and power amplifier 12. As a result, mismatching loss due to wiring loss or wiring variation can further be reduced, and thus it is possible to further improve the electrical characteristics of radio frequency module 1.

In addition, for example, in radio frequency module 1 according to the present embodiment, each of power amplifier 11 and power amplifier 12 may be a multistage amplifier, and in a plan view of module board 91, the footprint of switch 54 need not overlap the footprint of amplifying element 11b that corresponds to an output stage of power amplifier 11 or the footprint of amplifying element 12b that corresponds to an output stage of power amplifier 12.

According to this configuration, it is possible to space switch 54 from the output stages of power amplifiers 11 and 12. As a result, it is possible to reduce the risk of failure of switch 54 due to heat emitted from the output stages of power amplifiers 11 and 12. In addition, under a condition that a heat transfer path is formed from the output stages of power amplifiers 11 and 12 to the mother board, it is possible to prevent the heat transfer path from being blocked by switch 54.

In addition, for example, radio frequency module 1 according to the present embodiment may further include low noise amplifier 21, and semiconductor device 10 and low noise amplifier 21 may be disposed on mutually opposite surfaces of module board 91.

According to this configuration, semiconductor device 10 and low noise amplifier 21 can be disposed on the both surfaces of module board 91, and thus it is possible to promote miniaturization of radio frequency module 1. In addition, since module board 91 is located between power amplifiers 11 and 12 and low noise amplifier 21, it is possible to improve the isolation characteristics between power amplifiers 11 and 12 and low noise amplifier 21.

In addition, for example, radio frequency module 1 according to the present embodiment may further include a plurality of bump electrodes 150 as a plurality of external-connection terminals, module board 91 may include principal surface 91a and principal surface 91b on opposite sides of module board 91, semiconductor device 10 and semiconductor device 50 may be disposed on principal surface 91a, and the plurality of bump electrodes 150 and low noise amplifier 21 may be disposed on principal surface 91b.

According to this configuration, it is possible to dispose power amplifiers 11 and 12 on principal surface 91a and dispose low noise amplifier 21 on principal surface 91b. As a result, the heat transfer path from power amplifiers 11 and 12 to the motherboard can be easily ensured, and thus it is possible to improve the heat dissipation property of power amplifiers 11 and 12.

In addition, communication device 5 according to the present embodiment includes: RFIC 3 configured to process a radio frequency signal; and radio frequency module 1 configured to transfer the radio frequency signal between RFIC 3 and antenna 2.

According to this configuration, communication device 5 can yield advantageous effects equivalent to the advantageous effects yielded by radio frequency module 1.

Embodiment 2

Next, Embodiment 2 will be described. The present embodiment is different from the above-described Embodiment 1 mainly in that a transmission IN switch is also contained in semiconductor devices that are stacked. Hereinafter, the present embodiment will be described focusing on the points of difference from the above-described embodiment 1, with reference to the drawings.

It should be noted that the circuit configuration of a semiconductor module according to the present embodiment is equivalent to the circuit configuration of the above-described Embodiment 1, and thus the illustration and description of the circuit configuration will be omitted.

2.1 Component Arrangement of Radio Frequency Module 1A

Figure 4:
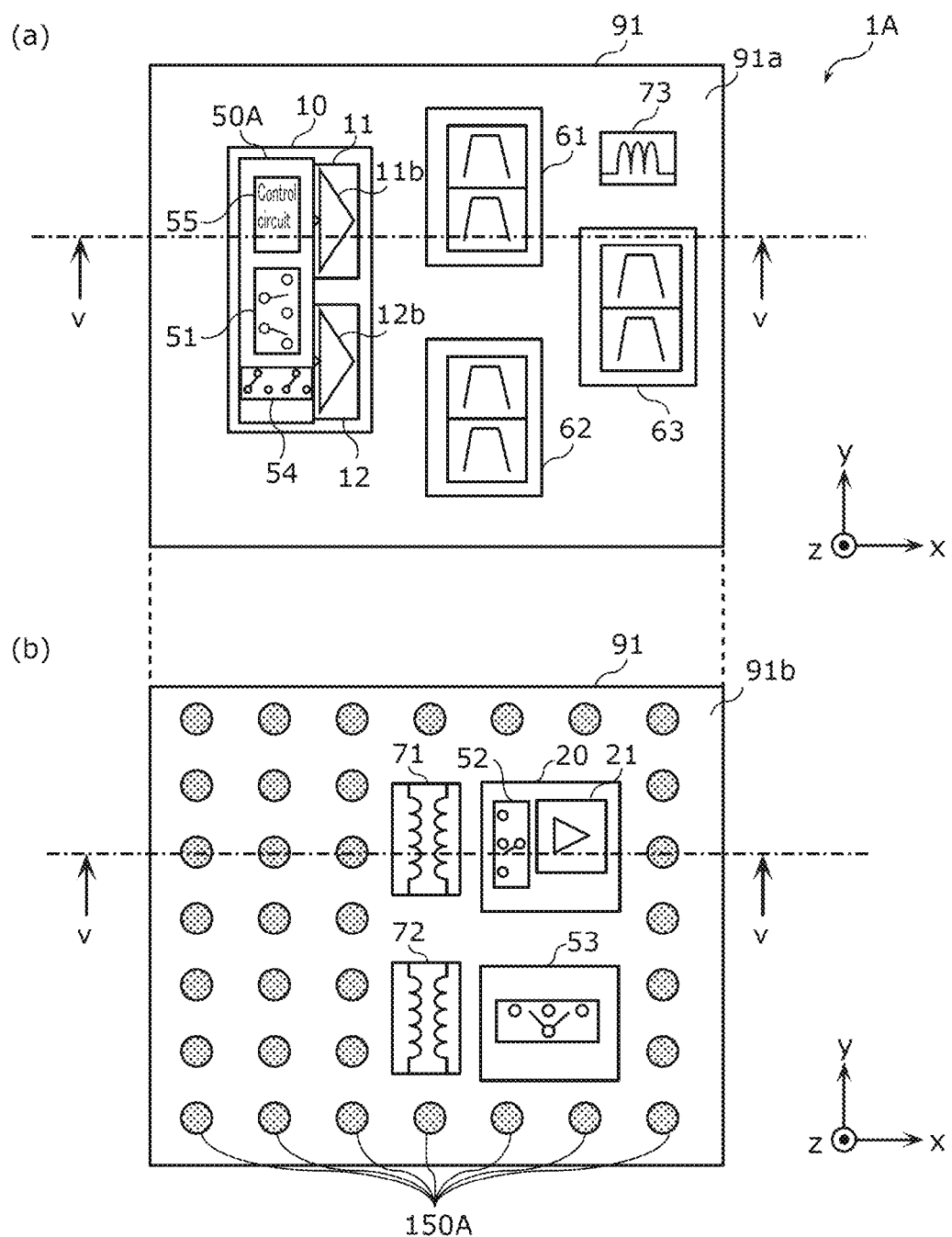
FIG. 4 illustrates a plan view of a radio frequency module according to Embodiment 2.
Figure 5:
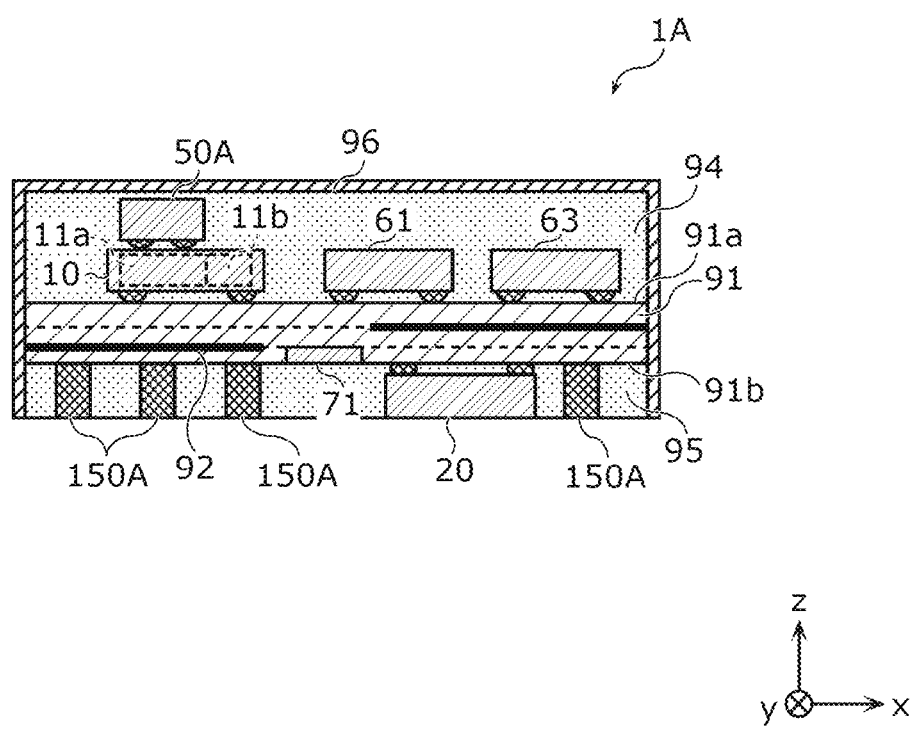
FIG. 5 illustrates a cross-sectional view of the radio frequency module according to Embodiment 2.

The following describes in detail the component arrangement of radio frequency module 1A, with reference to FIG. 4 and FIG. 5.

FIG. 4 illustrates a plan view of radio frequency module 1A according to Embodiment 2. In FIG. 4, (a) illustrates a view when principal surface 91a of module board 91 is viewed from the z-axis positive side, and (b) illustrates a view when principal surface 91b of module board 91 is viewed through from the z-axis positive side. FIG. 5 illustrates a cross-sectional view of radio frequency module 1A according to Embodiment 2. The cross-sectional surface of radio frequency module 1A illustrated in FIG. 5 is a cross-sectional surface taken along line v-v of FIG. 4.

As illustrated in FIG. 4 and FIG. 5, radio frequency module 1A further includes module board 91, ground electrode pattern 92, resin components 94 and 95, shielding electrode layer 96, and a plurality of post electrodes 150A, in addition to the circuit components that contain the circuit elements illustrated in FIG. 1. It should be noted that illustration of resin components 94 and 95 and shielding electrode layer 96 is omitted in FIG. 4.

As illustrated in (a) in FIG. 4, semiconductor device 10 that contains power amplifiers 11 and 12, semiconductor device 50A that contains switches 51 and 54 and control circuit 55, and duplexers 61 to 63 are disposed on principal surface 91a.

Semiconductor device 50A is stacked above semiconductor device 10 in the same manner as semiconductor device 50 according to Embodiment 1.

As illustrated in (b) in FIG. 4, semiconductor device 20 that contains low noise amplifier 21 and switch 52, and switches 53 are disposed on principal surface 91b.

Resin component 94 is disposed on principal surface 91a of module board 91, and covers the circuit components on principal surface 91a. Resin component 95 is disposed on principal surface 91b of module board 91, and covers the circuit components on principal surface 91b. Resin components 94 and 95 each have a function of ensuring reliability such as a mechanical strength and moisture resistance of the components disposed on principal surfaces 91a and 91b.

Shielding electrode layer 96 is a metal thin film formed by sputtering, for example, to cover an upper surface and side surfaces of resin component 94 and side surfaces of module board 91 and resin component 95. Shielding electrode layer 96 is set to a ground potential, and inhibits an exogenous noise from entering the circuit components included in radio frequency module 1A.

The plurality of post electrodes 150A form a plurality of external-connection terminals including antenna connection terminal 100, the plurality of radio frequency input terminals 110, radio frequency output terminal 121, and control terminal 131. Each of the plurality of post electrodes 150A is disposed on principal surface 91b of module board 91, and extends perpendicularly from principal surface 91b. In addition, each of the plurality of post electrodes 150A penetrates through resin component 95, and one end thereof is exposed from resin component 95. The one end of each of the plurality of post electrodes 150A exposed from resin component 95 is connected to an input/output terminal and/or a ground electrode, etc. on a motherboard located in the z-axis negative direction relative to radio frequency module 1A.

It should be noted that each of the components on module board 91 is connected to a pad electrode (not illustrated) or the like on module board 91 and/or other components via a bump electrode, for example.

2.2 Advantageous Effects, Etc.

In addition, for example, in radio frequency module 1A according to the present embodiment, semiconductor device 50A may further contain switch 54 including terminal 541 connected to an input terminal of power amplifier 11 and terminal 544 connected to an input terminal of power amplifier 12.

According to this configuration, it is possible to stack switch 54 connected to the input terminals of power amplifiers 11 and 12 on power amplifiers 11 and 12. As a result, it is possible to reduce the lengths of the lines between switch 54 and power amplifier 11 and between switch 54 and power amplifier 12. As a result, mismatching loss due to wiring loss or wiring variation can be reduced, and thus it is possible to further improve the electrical characteristics of radio frequency module 1A.

OTHER EMBODIMENTS

Although the radio frequency module and the communication device according to the present disclosure have been described above based on the embodiments, the radio frequency module and the communication device according to the present disclosure are not limited to the foregoing embodiments. The present disclosure also encompasses other embodiments achieved by combining arbitrary structural elements in the above-described embodiments, variations resulting from various modifications to the above-described embodiments that may be conceived by those skilled in the art without departing from the essence of the present disclosure, and various devices that include the above-described radio frequency module and the above-described communication device.

For example, in the circuit configurations of the radio frequency module and the communication device according to each of the foregoing embodiments, another circuit element and line, for example, may be inserted in a path connecting circuit elements and a signal path which are disclosed in the drawings. For example, an impedance matching circuit may be inserted between switch 53 and each of duplexers 61 to 63. The impedance matching circuit can be implemented by an inductor and/or a capacitor, for example.

It should be noted that, although semiconductor devices 50 or 50A is stacked above semiconductor device 10 according to the above-described embodiments, the present disclosure is not limited to this configuration. More specifically, the up-down relationship between the two semiconductor devices is not limited, and it is sufficient if semiconductor device 10 and semiconductor device 50 or 50A are stacked together and disposed on module board 91. Accordingly, semiconductor device 10 may be stacked on semiconductor device 50 or 50A. It is possible to achieve miniaturization of radio frequency module 1 or 1A in this case as well.

It should be noted that, although at least switch 51 and control circuit 55 are contained in semiconductor device 50 or 50A stacked on semiconductor device 10 according to the above-described embodiments, the present disclosure is not limited to this configuration. For example, in each of the above-described embodiments, semiconductor device 50 or 50A may contain only switch 54, and switch 51 and control circuit 55 need not necessarily be contained in semiconductor device 50 or 50A. In other words, it is sufficient if at least one of switch 51, switch 54, or control circuit 55 is contained in semiconductor device 50 or 50A. In other words, only arbitrary one of, arbitrary two of, or all of switch 51, switch 54, and control circuit 55 may be contained in each of semiconductor device 50 and 50A. In any case, it is possible to achieve miniaturization of the radio frequency module.

It should be noted that, although circuit components are disposed on both surfaces of module board 91 according to the above-described embodiments, the present disclosure is not limited to this configuration. For example, in Embodiment 1, semiconductor device 20 that contains low noise amplifier 21 and switch 52, and switches 53 and 54 may also be disposed on principal surface 91a of module board 91. In addition, for example, in Embodiment 2, semiconductor device 20 and switch 53 may also be disposed on principal surface 91a of module board 91.

It should be noted that the arrangement of the components according to each of the above-described embodiments is one example, and the present disclosure is not limited to this example. For example, in Embodiment 1, semiconductor devices 10 and 50 may be disposed on principal surface 91b, and semiconductor device 20 may be disposed on principal surface 91a.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable widely to communication apparatuses such as mobile phones as a radio frequency module disposed in a front-end unit.

The invention claimed is:

1. A radio frequency module, comprising:
a module board;
a first semiconductor device containing a first power amplifier configured to amplify a radio frequency signal of a first communication band and a second power amplifier configured to amplify a radio frequency signal of a second communication band, which is different from the first communication band;
a second semiconductor device containing a control circuit configured to control the first power amplifier and the second power amplifier; and
a low noise amplifier, wherein
the first semiconductor device and the second semiconductor device are stacked together and disposed on the module board, and
the first semiconductor device and the low noise amplifier are disposed on mutually opposite surfaces of the module board.

2. The radio frequency module of claim 1, wherein
in a plan view of the module board, a footprint of the second semiconductor device overlaps both a footprint of the first power amplifier and a footprint of the second power amplifier.

3. The radio frequency module of claim 2, wherein
in a plan view of the module board, a footprint of the second semiconductor device overlaps each of an input stage of the first power amplifier and an input stage of the second power amplifier.

4. The radio frequency module of claim 3, wherein
in a plan view of the module board, the footprint of the second semiconductor device does not overlap a footprint of an output stage of the first power amplifier or a footprint of an output stage of the second power amplifier.

5. The radio frequency module of claim 1, wherein
the first semiconductor device is disposed on the module board, and
the second semiconductor device is stacked on the first semiconductor device.

6. The radio frequency module of claim 1, wherein
the second semiconductor device contains a switch including a first terminal connected to an output terminal of the first power amplifier and a second terminal connected to an output terminal of the second power amplifier.

7. The radio frequency module of claim 1, wherein
the second semiconductor device contains a switch including a first terminal connected to an input terminal of the first power amplifier and a second terminal connected to an input terminal of the second power amplifier.

8. The radio frequency module of claim 1, further comprising:
a switch including a first terminal connected to an input terminal of the first power amplifier and a second terminal connected to an input terminal of the second power amplifier.

9. The radio frequency module of claim 8, wherein
the first semiconductor device and the switch are disposed on mutually opposite surfaces of the module board.

10. The radio frequency module of claim 9, further comprising:
a plurality of external-connection terminals, wherein
the module board includes a first principal surface and a second principal surface on opposite sides of the module board, and
the first semiconductor device and the second semiconductor device are disposed on the first principal surface.

11. The radio frequency module of claim 10, wherein
the plurality of external-connection terminals and the switch are disposed on the second principal surface.

12. The radio frequency module of claim 8, wherein
in a plan view of the module board, a footprint of the switch overlaps a footprint of the first semiconductor device.

13. The radio frequency module of claim 12, wherein
each of the first power amplifier and the second power amplifier is a multistage amplifier.

14. The radio frequency module of claim 13, wherein
in a plan view of the module board, the footprint of the switch does not overlap a footprint of an output stage of the first power amplifier or a footprint of an output stage of the second power amplifier.

15. The radio frequency module of claim 1, further comprising:
a plurality of external-connection terminals, wherein
the module board includes a first principal surface and a second principal surface on opposite sides of the module board, and
the first semiconductor device and the second semiconductor device are disposed on the first principal surface.

16. The radio frequency module of claim 15, wherein
the plurality of external-connection terminals and the low noise amplifier are disposed on the second principal surface.

17. A communication device, comprising:
a signal processing circuit configured to process a radio frequency signal; and
the radio frequency module configured to transfer the radio frequency signal between the signal processing circuit and an antenna, wherein
the radio frequency module includes
a module board;
a first semiconductor device containing a first power amplifier configured to amplify a radio frequency signal of a first communication band and a second power amplifier configured to amplify a radio frequency signal of a second communication band, which is different from the first communication band;
a second semiconductor device containing a control circuit configured to control the first power amplifier and the second power amplifier; and
a low noise amplifier, wherein
the first semiconductor device and the second semiconductor device are stacked together and disposed on the module board, and
the first semiconductor device and the low noise amplifier are disposed on mutually opposite surfaces of the module board.

18. A radio frequency module, comprising:
a module board including a first principal surface and a second principal surface on opposite sides of the module board;
a first semiconductor device disposed on the first principal surface and containing a first power amplifier configured to amplify a radio frequency signal of a first communication band and a second power amplifier configured to amplify a radio frequency signal of a second communication band, which is different from the first communication band;
a second semiconductor device stacked on the first semiconductor device and containing a control circuit configured to control the first power amplifier and the second power amplifier; and
a low noise amplifier, wherein
the first semiconductor device and the low noise amplifier are disposed on mutually opposite surfaces of the module board.

19. The radio frequency module of claim 18, wherein
in a plan view of the module board, a footprint of the second semiconductor device overlaps both a footprint of the first power amplifier and a footprint of the second power amplifier.

* * * * *